(12) United States Patent
Chung et al.

(10) Patent No.: US 9,313,900 B2
(45) Date of Patent: Apr. 12, 2016

(54) METHOD FOR MANUFACTURING A DOUBLE-SIDED PRINTED CIRCUIT BOARD

(75) Inventors: Kwang Choon Chung, Yongin-si (KR); Young-Koo Han, Bucheon-si (KR); Myung-Bong Yoo, Yongin-si (KR); Nam-Boo Cho, Anyang-si (KR); Young-Ho Han, Bucheon-si (KR); Kyong-Min Lee, Anyang-si (KR); Kwang-Baek Yoon, Siheung-si (KR); Hee-Yong Ahn, Gunpo-si (KR); Su-Han Kim, Ansan-si (KR)

(73) Assignees: Inktec Co., Ltd., Ansan-si (KR); Haeun Chemtec Co., Ltd., Ansan-si (KR)

( * ) Notice: Subject to any disclaimer, the term of this patent is extended or adjusted under 35 U.S.C. 154(b) by 517 days.

(21) Appl. No.: 13/638,716

(22) PCT Filed: Apr. 2, 2010

(86) PCT No.: PCT/KR2010/002028
§ 371 (c)(1),
(2), (4) Date: Nov. 19, 2012

(87) PCT Pub. No.: WO2011/122723
PCT Pub. Date: Oct. 6, 2011

(65) Prior Publication Data
US 2013/0056250 A1    Mar. 7, 2013

(51) Int. Cl.
*H05K 3/40* (2006.01)
*H05K 3/42* (2006.01)
*H05K 3/24* (2006.01)
*H05K 3/00* (2006.01)
*H05K 3/06* (2006.01)
*H05K 3/10* (2006.01)
*H05K 3/12* (2006.01)

(52) U.S. Cl.
CPC ........... *H05K 3/427* (2013.01); *H05K 3/246* (2013.01); *H05K 3/0094* (2013.01); *H05K 3/06* (2013.01); *H05K 3/105* (2013.01); *H05K 3/12* (2013.01); *H05K 2203/121* (2013.01); *Y10T 29/49155* (2015.01)

(58) Field of Classification Search
CPC ......... H05K 3/36; H05K 3/361; H05K 3/368; H05K 3/382; H05K 3/4069; H05K 3/0094; H05K 3/06; H05K 3/105; H05K 3/12; H05K 3/246; H05K 3/427; H05K 2203/121; Y10T 29/49155
See application file for complete search history.

(56) References Cited

U.S. PATENT DOCUMENTS 5,638,597 A * 6/1997 Cutting et al. ............... 29/830
5,690,837 A * 11/1997 Nakaso et al. ............... 216/17
(Continued)

FOREIGN PATENT DOCUMENTS

CN   101160023 A   4/2008
EP    2146560 A1   1/2010
(Continued)

*Primary Examiner* — Carl Arbes
(74) *Attorney, Agent, or Firm* — The Webb Law Firm

(57) ABSTRACT

Disclosed is a method for manufacturing a double-sided printed circuit board (PCB) having a circuit pattern by printing a conductive paste. According to the method of the present invention, a circuit pattern that is precise and highly conductive can be formed, and a reduction in raw materials and the simplification of processes are made possible. Also, due to the printing of the conductive paste, short-circuit can be prevented even when a conductive layer is bent or exposed to heat or physical impact.

16 Claims, 4 Drawing Sheets

(56) References Cited

U.S. PATENT DOCUMENTS

| | | | |
|---|---|---|---|
| 6,329,610 B1* | 12/2001 | Takubo et al. | 174/264 |
| 6,518,513 B1* | 2/2003 | Enomoto et al. | 174/262 |
| 7,707,716 B2* | 5/2010 | Song et al. | 29/852 |
| 8,474,135 B2* | 7/2013 | Kim et al. | 29/852 |
| 2005/0006140 A1* | 1/2005 | Birgel et al. | 174/260 |
| 2007/0176150 A1 | 8/2007 | Chung et al. | |
| 2007/0261234 A1* | 11/2007 | Song et al. | 29/829 |
| 2008/0081125 A1 | 4/2008 | Jung et al. | |
| 2008/0206488 A1 | 8/2008 | Chung et al. | |
| 2009/0120800 A1 | 5/2009 | Chung et al. | |
| 2010/0247798 A1 | 9/2010 | Chung et al. | |

FOREIGN PATENT DOCUMENTS

| | | | |
|---|---|---|---|
| JP | S63272097 A | * | 11/1988 |
| JP | 6224528 A | | 8/1994 |
| JP | 2006108270 A | | 4/2006 |
| KR | 1020040075595 A | | 8/2004 |
| KR | 1020040084570 A | | 10/2004 |
| KR | 1020050001029 A | | 1/2005 |
| KR | 1020060090180 A | | 8/2006 |
| KR | 1020060101570 A | | 9/2006 |
| KR | 1020090011528 B1 | | 2/2009 |
| KR | 1020100038015 A | | 4/2010 |

* cited by examiner

2a

2b

2c

2d

2e

2a

2b

2c

2d

2e

2f

2a

2b

2c

2d

2e

METHOD FOR MANUFACTURING A DOUBLE-SIDED PRINTED CIRCUIT BOARD

TECHNICAL FIELD

The present invention relates to a method for manufacturing a double-sided printed circuit board, and more particularly, to a method for manufacturing a double-sided printed circuit board capable of forming a precise and highly conductive circuit pattern and reducing raw materials and manufacturing processes.

BACKGROUND ART

Generally, a printed circuit board is an electronic component electrically connecting various kinds of electronic components mounted thereon to each other in a board shape.

The printed circuit board is mainly divided into a rigid printed circuit board and a flexible printed circuit board according to a rigid or flexible material of a substrate, and recently, a rigid-flexible composite printed circuit board has been developed.

Initially, in the printed circuit board, a product having a relatively simple structure such as a structure in which a printed wiring is formed on a single side thereof was mainly used. However, in accordance with the gradual trend toward lightness, miniaturization, and multifunction of the electronic product, also in the flexible circuit board, wiring density has been increased and the structure thereof has been complicated and developed to the multi-layered product.

As the printed circuit board, there are various kinds such as a single layer, double side, multilayer, and the like, according to a layer of the circuit pattern of the wiring structure, and a suitable printed circuit board is designed and manufactured according to a structure and functions of an electronic device to thereby be applied to the product.

Particularly, the flexible printed circuit board may enable miniaturization and lightness of the electronic product and have excellent flexibility and softness, thereby freely connecting two circuits or components to each other that are not adjacent to each other while performing a role of the printed circuit board. Therefore, the flexible printed circuit board has been widely used in military equipment, medical equipment, general industrial machine, or the like, as well as electronic devices such as a mobile phone, an MP3, a camcorder, a printer, a display, or the like. Particularly, a product requiring flexural property of the circuit board such as the mobile phone, the camcorder, a notebook, the display, or the like, has increased, a demand for the flexible printed circuit board has increased.

A general method for manufacturing a double-sided printed circuit board among the printed circuit boards, for example, a method for manufacturing a double-sided flexible printed circuit board will be described as follows. After a double-sided copper clad laminate (CCL) film in which thin-film copper is laminated on both sides of an insulation film such as a polyimide film or a polyester film is prepared, via-holes are formed at a predetermined position of the CCL film using a drill, or the like, in order to electrically connect portions to each other at which a circuit pattern of the copper layer is formed, and then a plating process is performed on the via-hole, such that the copper layers are electrically connected to each other. Next, the double-sided flexible printed circuit board may be manufactured by a method of using a photosensitive film in both of the copper layers of the CCL film or applying liquid thereto to process each of the copper layers to a predetermined circuit pattern through exposing, developing, etching, delaminating processes.

In the manufacturing method according to the related art, a fine pattern may be formed, but a manufacturing process is complicated, raw material loss is significant, environmental pollution is generated. Recently, as a printed electronics technology is developed, a method for manufacturing a printed circuit board using a printing method has been developed, but in the current printing technology, there is a limitation in a width of the printed wiring.

Meanwhile, a method for manufacturing a double-sided flexible printed circuit board simultaneously using the etching method and the printing method is closed in Japanese Patent Application Laid-Open No. 1994-224528.

In the above manufacturing method, a through-hole is formed at a portion at which inner and outer surfaces of a film substrate are electrically connected to each other. At the same time, a metal foil is deposited on one entire surface of the film substrate, this metal foil is removed by the etching process so as to have a predetermined pattern to form a wiring conductor part, and closing plate part closing a portion of the through-hole is formed. In the other surface of the film substrate, a conductive paste is filled in the through-hole with printed wiring conductor part formed by depositing the conductive paste thereon using the printing method, and the wiring conductor part formed by the etching process using the conductive paste and the printed wiring conductor part formed by the printing method are electrically connected to each other, thereby manufacturing the double-sided flexible printed circuit board.

However, in the method, the printed wiring should be formed of the conductive paste by the printing method and at the same time the through-hole should be filled with the conductive paste, but the printing method for forming the printed wiring conductor part using a conductive paste filled in the through-hole to form a bump is extremely limited, and on the contrary, it is difficult to fill a conductive paste capable of easily forming the printed wiring in the through-hole to form the bump. In addition, in the flexible printed circuit board manufactured by the method, it is highly likely that a connection part formed at the through-hole is contracted or a crack is generated even when the connection part is exposed to heat or physical impact to thereby be disconnected, and in view of process, a process of forming a separate closing plate part in order to prevent the conductive paste filled in the through-hole from being leaked should be added. Therefore, the method is not industrially used. Further, since a conductive paste layer does not have sufficient adhesive force with the substrate, an interface between the printed circuit formed by the conductive paste and a connection conductor part forming the bump of the via-hole is often separated or detached from each other. Therefore, the method is not substantially practicable.

DISCLOSURE

Technical Problem

An object of the present invention is to provide a method for manufacturing a double-sided printed circuit board capable of forming a precise and highly conductive circuit pattern, reducing raw materials and manufacturing processes, improving adhesive force of a circuit part and a connection conductor part formed by printing a paste.

Therefore, with the method for manufacturing a double-sided printed circuit board according to the present invention, a double-sided flexible printed circuit board having high reliability without risk of disconnection even when the conductive layer is bent, refracted, or exposed to heat or physical impact may be provided.

Technical Solution

In one general aspect, a method for manufacturing a double-sided flexible printed circuit board includes:

(A) preparing a single-sided copper clad laminate or forming a copper layer on a single side of a base substrate to manufacture the single-sided copper clad laminate;

(B) forming via-holes in the single-sided copper clad laminate;

(C) printing a conductive paste on the other side of the copper foil of the single-sided copper clad laminate to form a plated bottom layer on the via-hole simultaneously with forming a circuit pattern;

(D) plating a copper clad surface of the single-sided copper clad laminate, the via-hole including the plated bottom layer formed thereon, and the circuit pattern formed by printing the conductive paste;

(E) forming a coverlay layer on the conductive paste-printed surface; and (F) etching the copper clad surface of the copper clad laminate to form a circuit.

In another general aspect, a method for manufacturing a double-sided printed circuit board includes:

(A) preparing a single-sided copper clad laminate or forming a copper layer on a single side of a base substrate to manufacture the single-sided copper clad laminate;

(B) forming a primer layer on an opposite side of the copper clad laminate in order to improve adhesive force;

(C) forming via-holes in the single-sided copper clad laminate;

(D) printing a conductive paste on the other side of the copper foil of the single-sided copper clad laminate to form a plated bottom layer on the via-hole simultaneously with forming a circuit pattern;

(E) plating a copper clad surface of the single-sided copper clad laminate, the via-hole including the plated bottom layer formed thereon, and the circuit pattern formed by printing the conductive paste;

(F) forming a coverlay layer on the conductive paste-printed surface; and (G) etching the copper clad surface of the copper clad laminate to form a circuit.

Meanwhile, a sequence of step B and step C may be changed in this case.

In another general aspect, a method for manufacturing a double-sided printed circuit board includes:

(A) preparing a single-sided copper clad laminate or forming a copper layer on a single side of a base substrate to manufacture the single-sided copper clad laminate;

(B) forming via-holes in the single-sided copper clad laminate;

(C) printing a conductive paste on the other side of the copper foil of the single-sided copper clad laminate to form a plated bottom layer on the via-hole simultaneously with forming a circuit pattern;

(D) forming a coverlay layer on the printed circuit pattern surface;

(E) plating the copper clad surface and the via-hole including the plated bottom layer formed thereon; and (F) etching the copper clad surface of the copper clad laminate to form a circuit.

Hereinafter, the method for manufacturing a double-sided flexible printed circuit board according to the present invention will be described in detail with reference to accompanying drawings.

FIG. 1 is a flow chart describing a process of manufacturing a double-sided flexible printed circuit board according to the present invention. As shown in FIG. 1, the method for manufacturing a double-sided flexible printed circuit board according to the present invention includes:

(Step 1) preparing a single-sided copper clad laminate or forming a copper layer on a single side of a base substrate to manufacture the single-sided copper clad laminate;

(Step 2) forming via-holes in the single-sided copper clad laminate;

(Step 3) printing a conductive paste on the other side of the copper foil of the single-sided copper clad laminate to form a plated bottom layer on the via-hole simultaneously with forming a circuit pattern;

(Step 4) plating a copper clad surface of the single-sided copper clad laminate, via-hole including the plated bottom layer formed thereon, and the circuit pattern formed by printing the conductive paste;

(Step 5) forming a coverlay layer on the conductive paste-printed surface; and (Step 6) etching the copper clad surface of the copper clad laminate to form a circuit pattern as in the related art.

Further, the method may further include forming a primer layer for improving the adhesive force between the conductive paste and a film substrate as a pre-step of the printing of the conductive paste to form the plated bottom layer on the via-hole simultaneously with forming the circuit pattern (Step 3).

Meanwhile, in the present invention, after the forming of the coverlay layer on the conductive paste-printed surface (Step 5) is performed, and then the plating of the copper clad surface of the single-sided copper clad laminate and the via-hole including the plated bottom layer formed thereon (Step 4) may be performed.

Hereinafter, each process will be described in detail with reference to FIGS. 2a to 2e.

Step 1: Step of Preparing a Single-sided Copper Clad Laminate or Forming a Copper Layer on a Single Side of a Base Substrate to Manufacture the Single-sided Copper Clad Laminate The present step may be a step of forming a copper foil layer on a single side of a base substrate to manufacture a single-sided copper clad laminate. The single-sided copper clad laminate in the present step may be manufactured by a general method according to the related art. That is, the copper foil may be adhered to a single side of a polyimide film, or the like, using an epoxy-NBR based adhesive, or the like, and then cured, such that the single-sided copper clad laminate may be manufactured. In addition, since the single-sided copper clad laminate may be easily acquired in the market, a ready-made single-sided copper clad laminate may be used.

The single-sided flexible copper clad laminate manufactured or prepared in the present step is shown in FIG. 2a.

Step 2: Step of Forming Via-holes in the Single-sided Copper Clad Laminate

The present step may be a step of forming the via-hole in the single-sided copper clad laminate manufactured or prepared in Step 1.

The via-hole may be formed by hole processing according to a printed circuit board (PCB) design using a computerized numerical control (CNC) drill, a UV-laser, a YAG laser or a $CO_2$ laser, punching, or the like. This is shown in FIG. 2b.

Step 3: Step of Printing a Conductive Paste on the Other Side of the Copper Foil of the Single-sided Copper Clad Laminate to Form a Plated Bottom Layer on the Via-hole Simultaneously with Forming a Circuit Pattern This step is a step of charging (printing) the conductive paste in the via-hole to form the plated bottom layer simultaneously with printing a conductive paste on the other side of the copper foil of the single-sided copper clad laminate to form a circuit pattern. This is shown in FIG. 2c.

Examples of the conductive paste used in the present step may include a conductive material such as Ag, Pb, Pt, Ni, Cu, Ag/Pb, or the like, or a conductive paste containing an organometallic compound.

In the present invention, a conductive paste containing an organic silver complex compound among the organometallic compounds may be used. The preferable reason of using the organic silver complex compound is that the compound has excellent stability and excellent solubility for solvent and is easily decomposed at a relatively low temperature, thereby making it possible to easily form a metal pattern. Further, the conductive paste containing the organic silver complex compound may further contain a conductive material such as a conductor, a metal precursor, or the like.

Particularly, since the circuit pattern and plated bottom layer have a unique thickness, excellent conductivity, and a low firing temperature, and a residue except for the conductive material is not present after firing, a conductive paste containing an organic silver complex compound having a specific structure in Patent Application No. 2006-0011083 filed by the present applicant may be preferably used.

The conductive paste filed by the present applicant may be a conductive paste containing a silver complex compound obtained by reacting at least one silver compound of the following Chemical Formula 1 with at least one ammonium carbamate- or ammonium carbonate-based compound of the following Chemical Formula 2, 3, or 4.

$$Ag_nX \quad \text{[Chemical Formula 1]}$$

(n may be an integer of 1 to 4, and X may be a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof.)

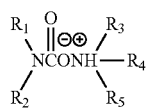

[Chemical Formula 2]

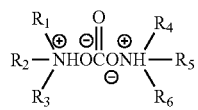

[Chemical Formula 3]

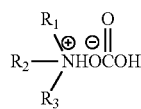

[Chemical Formula 4]

($R_1$, $R_2$, $R_3$, $R_4$, $R_5$, and $R_6$ may be the same or different and be substituents selected from hydrogen, aliphatic or alicyclic alkyl, aryl, or aralkyl having 1 to 30 carbon atoms, functional group substituted alkyl or aryl, a heterocyclic compound, a polymer compound, and derivatives thereof, respectively.)

In addition, the conductive paste containing the organic silver complex compound may contain a conductor, a metal precursor, or a mixture of at least one thereof, which was filed by the present applicant in Patent Applicant No. 2005-0023013.

The conductor is not particularly limited. That is, any conductor known in the art may be used as long as it coincides with the object of the present invention. For example, a kind, a size, or a shape of the conductor or the metal precursor is not particularly limited. That is, as an example of the conductor includes at least one metal selected from transition metals such as Ag, Au, Cu, Ni, Co, Pd, Pt, Ti, V, Mn, Fe, Cr, Zr, Nb, Mo, W, Ru, Cd, Ta, Re, Os, or Ir, at least one metal selected from lanthanide metals such as Sm or Eu, and actinide metals such as Ac or Th, an alloy thereof, or alloy oxide thereof. In addition, an example of the conductor includes conductive carbon black, graphite, carbon nano-tubes, conductive polymers, such as polyacetylene, polypyrrole, polyaniline, polythiophene, and derivatives thereof, and the like.

Further, the metal precursor is not particularly limited. That is, any metal precursor may be used as long as it coincides with the object of the present invention, and particularly, when the metal precursor shows conductivity through thermal treatment, oxidation or reduction treatment, infra-red (IR) treatment, ultra-violet (UV) treatment, electron beam treatment, laser treatment, or the like. For example, the metal precursor may contain an organic metal compound, a metal salt, or the like, and be represented by MnX, where M is selected from metal groups among the conductors, n is an integer of 10 or less, and X indicates oxygen, sulfur, halogen, cyano, cyanate, carbonate, nitrate, nitrite, sulfate, phosphate, thiocyanate, chlorate, perchlorate, tetrafluoroborate, acetylacetonate, mercapto, amide, alkoxide, carboxylate, or the like. More specifically, for example, at least one kind selected from metal carboxylate such as gold acetate, palladium oxalate, silver 2-ethylhexanoate, copper 2-ethylhexanoate, iron stearate, nickel formate, zinc citrate and metal compounds such as silver nitrate, copper cyanate, cobalt carbonate, platinum chloride, chlorauric acid, tetrabutoxytitanium, dimethoxy-zirconium dichloride, aluminum isopropoxide, tin tetrafluoroborate, vanadium oxide, indium-tin oxide, ruthenium oxide, tantalum methoxide, bismuth acetate, dodecyl mercapto gold, indium acetylacetonate, and the like, may be used together as the metal precursor. Further, the conductor and the metal precursor may have a spherical shape, a linear shape, a plate shape, or a mixed shape thereof, and be used in various states, such as a particles state including nanoparticles, a powder state, a flake state, a colloid state, a hybrid state, a paste state, a sol state, a solution state, a mixed state of at least one thereof, or the like.

The size or the used amount of conductor or metal precursor is not particularly limited as long as the size or the amount coincides with characteristics of the conductive paste. That is, the size may be 50 μm or less in consideration of a plating thickness after firing, and more preferably, 1 nm to 25 μm, and the used amount is preferable as long as it is not over a predetermined limit, such that the firing temperature is not significantly increased or there is no problem in application or a pattern forming process. Generally, the used amount may be 1 to 90% by weight based on the total weight of the paste composition, and more preferably, 10 to 70%.

As described above, the conductive paste composition used in the present invention may be configured of the silver complex compound or the silver complex compound and the conductor, the metal precursor, or the mixture of at least one thereof, and as needed, further contain well-known additives such as a solvent, a stabilizer, a dispersant, a binder resin, a reducer, a surfactant, a wetting agent, a thixotropic agent, a leveling agent, or the like, as a component of the conductive paste composition of the present invention.

In addition, the conductive paste containing the organic silver composition in Patent Document No. 2003-0019724 filed by the present applicant may be used. The organic silver composition may be prepared by reacting silver oxide with a mixture of an amine-based compound and organic compounds such as a lactone-based compound, a lactam-based compound, a carbonate-based compound, a cyclic acid anhydride-based compound which react silver oxide to form organic silver to thereby be dissolved therein, and the conductive paste containing the organic silver composition may have advantages in adhesion to the substrate, printability, high conductivity, and the like, at the time of forming the pattern.

In the method of charging the conductive paste in the via-hole to form the plated bottom layer simultaneously with forming a circuit pattern using the conductive paste as described above, as a printing method, any method such as a gravure printing method, an inkjet printing method, an offset printing method, a silk screen printing method, a rotary screen printing method, a flexo printing method, an imprinting method, or the like, may be used, and the method may be selectively used according to the shape and the material of the substrate. In consideration of production efficiency and workability, a printing resolution, charging efficiency of the via-hole, and the like, the silk screen printing method, the rotary screen printing method, or flexo printing method may be preferably used.

The circuit pattern and the via-hole obtained as described above may be used to form a metal or metal oxide pattern through a post-treatment process such as oxidation or reduction treatment, thermal treatment, IR treatment, UV treatment, laser treatment. The post-treatment process may be generally thermal-treated under an inert atmosphere, but as needed, be performed under air, nitrogen, carbon monoxide, or mixed gas of hydrogen and air or another inert gas. The thermal treatment may be generally performed at 80 to 400° C., preferably 90 to 300° C., and more preferably 100 to 250° C. in order to improve properties of the thin-film. Additionally, in order to improve uniformity of the thin-film, the thermal treatment may be performed in at least two steps at a low temperature and a high temperature within the above-mentioned range. For example, the thermal treatment may be performed at 80 to 150° C. for 1 to 30 minutes and again be performed at 150 to 300° C. for 1 to 30 minutes.

Step 4: Step of Plating a Copper Clad Surface of the Single-sided Flexible Copper Clad Laminate, Via-hole Including the Plated Bottom Layer Formed Thereon, and/or the Circuit Pattern This step is a step of electroplating the copper clad surface of the flexible copper clad laminate including the coverlay layer formed in Step 4, the via-hole including the plated bottom layer formed thereon, and/or the circuit pattern, which is shown in FIG. 2d.

As a plating method, a method according to the related art may be used. However, for uniform electrodeposition, good plating distribution (minimizing a thick variation), and minimizing a void space or a dent space, an electroplating or electroless plating method may be selected and used, and as a material, copper, gold, silver, platinum, nickel, or the like, may be used.

Step 5: Step of Forming a Coverlay Layer on the Conductive Paste-printed Surface This step, which is a step of forming the coverlay layer on the surface on which the circuit pattern is printed using the conductive paste in Step 3, may be a step of forming the coverlay layer in order to protect the circuit pattern formed by the printing method in the etching process to be described below in FIG. 2e.

As the method of forming the coverlay layer, there are a method of using a polyimide film for a coverlay having a size of several to several ten μm to form the coverlay layer through a coverlay punching process, a laminating process, and a hot press processes, which is generally used and a method of forming the coverlay layer using photo solder resist (PSR) ink or baking paint containing an epoxy resin or polyamic acid to form the coverlay layer through a printing process and a curing process. As a printing method in this case, the silk screen printing method, a spray coater printing method, a roll coater printing method, a curtain coater printing method, or the like, may be used.

In addition, the coverlay layer may be formed by printing or coating thermal curing ink to cure the printed or coated ink using IR or UV. As a printing method in this case, a silk screen printing method and the rotary screen printing method may be preferably used in consideration of production efficiency, workability, and printability.

Step 6: Step of Forming a Circuit Pattern by an Etching Method According to the Related Art This step is a step of forming the circuit pattern on one side on which the copper foil is formed in the copper clad laminate plated in Step 5 by the etching method according to the related art, and the circuit to be actually used in the substrate may be formed through a dry film adhering process, an exposure process, a development process, and an etching process. Here, in the case in which a plating thickness needs to be adjusted, a thickness of the copper layer may be adjusted by soft etching.

In addition, as a pre-step of printing a conductive paste to form the plated bottom layer on the via-hole simultaneously with forming a circuit pattern (Step 3), forming a primer layer for improve the adhesive force between the conductive paste and a film substrate may be further included.

A primer composition may be used in a solid state or a liquid state, wherein the solid paint is configured of thermosetting resins and a curing agent, and the liquid painting is divided into a curable type paint including solid paint and a solvent, a dry type paint evaporating a solvent to form a resin film, and a photo-curable type paint including monomer and a photo initiator. At least one resin may be included as a component of the primer. Here, a leveling agent, a wetting agent, an adhesion promoter, an ultraviolet stabilizer, or the like may be used as needed.

The primer composition obtained as described above may be coated on the substrate by spraying, dipping, roll coating, or the like, thereby performing primer treatment for improving adhesion.

Meanwhile, after the forming of the coverlay layer on the conductive paste-printed surface (Step 5) is performed, and then the plating of the copper clad surface of the single-sided copper clad laminate and the via-hole including the plated bottom layer formed thereon (Step 4) may be performed.

This is a process in which a sequence of the above-mentioned Step 4 and Step 5 is changed and is to prevent an unnecessary portion from being plated in the case in which only a printed pattern of the conductive paste may obtain reliability such as conductivity to be desired, or the like, according to a specification of the PCB

ADVANTAGEOUS EFFECTS

As set forth above, with the method for manufacturing a double-sided printed circuit pattern according to the present invention, the precise and highly conductive circuit pattern may be formed, the raw materials and manufacturing processes may be reduced, and the double-sided flexible printed circuit board having high reliability that there is no risk of disconnection even when a conductive layer is bent, refracted, or exposed to heat or physical impact may be provided. In the present invention, the circuit of one side of the double-sided laminated printed circuit board has the circuit pattern manufactured by the printing method using the conductive paste, and the plating layer or the coverlay layer is formed or the plating layer and the coverlay layer are simultaneously formed, such that this circuit pattern may be protected at the time of etching. In addition, the problems such as separation of the adhesive layer or formation of crack, or the like, caused by adhesion, thermal or physical impact may be improved, thereby making it possible to increase the reliability of the product.

BEST MODE

Figure 1:
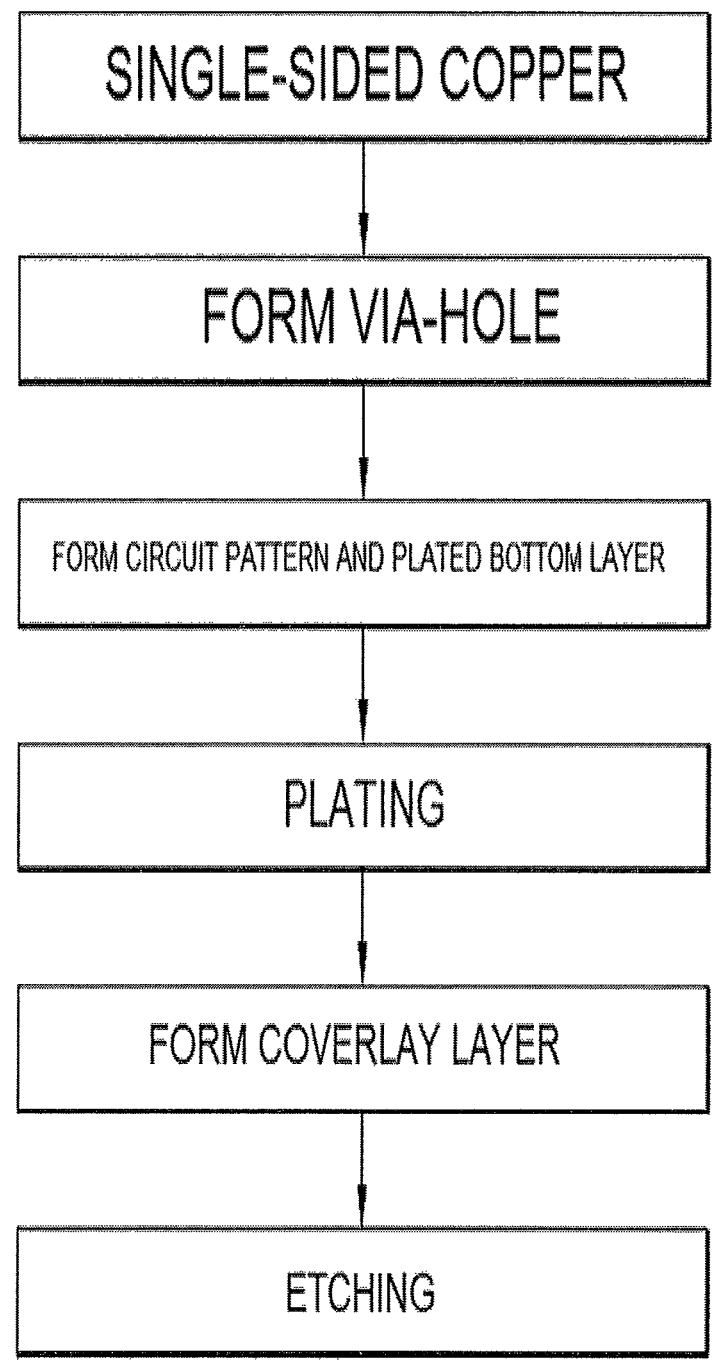
FIG. 1 is a flow chart describing a method for manufacturing a double-sided flexible printed circuit board according to an embodiment of the present invention.
Figure 2:
FIG. 2 is an example of a process flow chart in each step of the method for manufacturing a double-sided flexible printed circuit board according to the embodiment of the present invention.
Figure 2:
Figure 2:
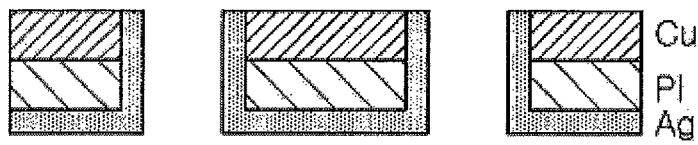
Figure 2:
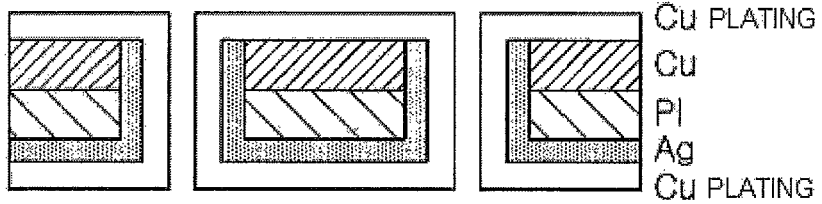
Figure 2:
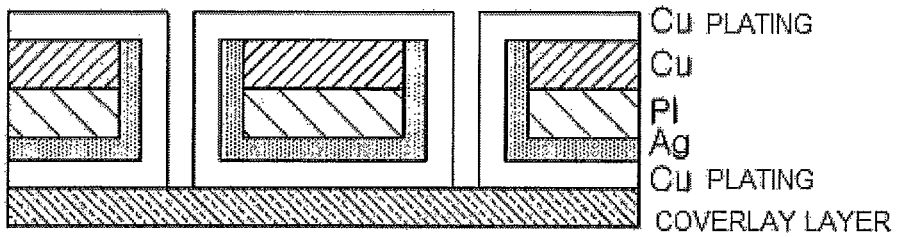
Figure 3:
FIG. 3 is an example of a process flow chart in each step of the method for manufacturing a double-sided flexible printed circuit board according to the embodiment of the present invention.
Figure 3:
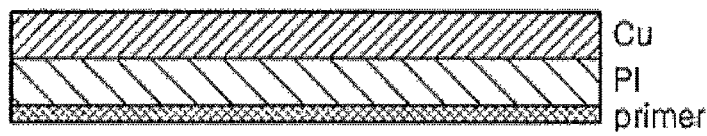
Figure 3:
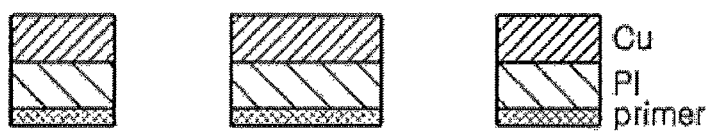
Figure 3:
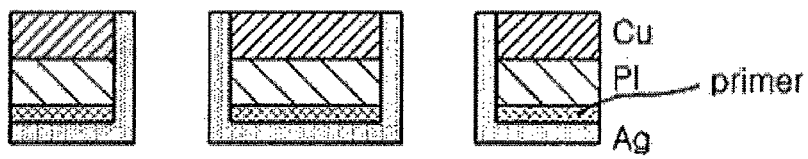
Figure 3:
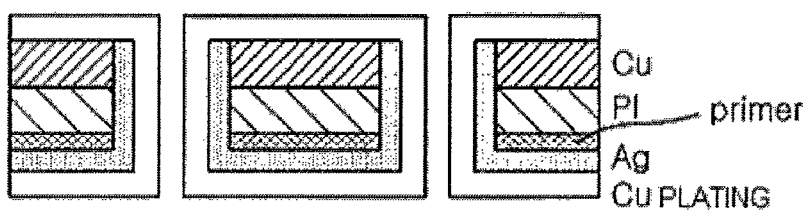
Figure 3:
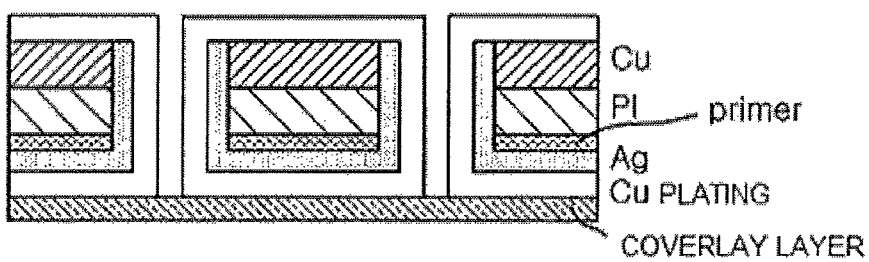
Figure 4:
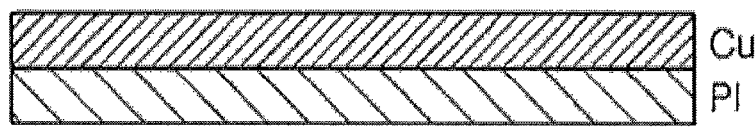
FIG. 4 is an example of a process flow chart in each step of the method for manufacturing a double-sided flexible printed circuit board according to the embodiment of the present invention.
Figure 4:
Figure 4:
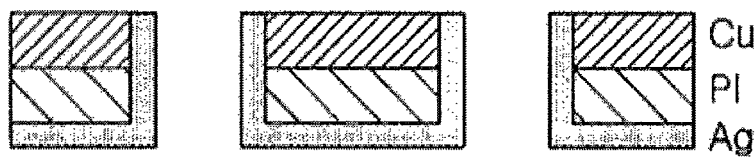
Figure 4:
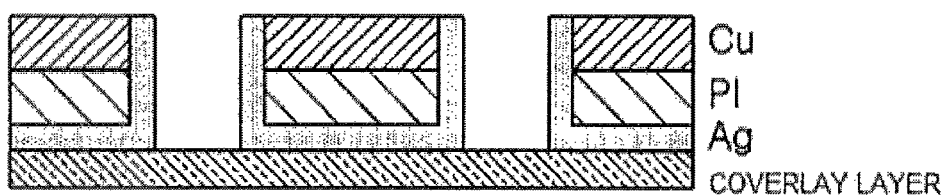
Figure 4:
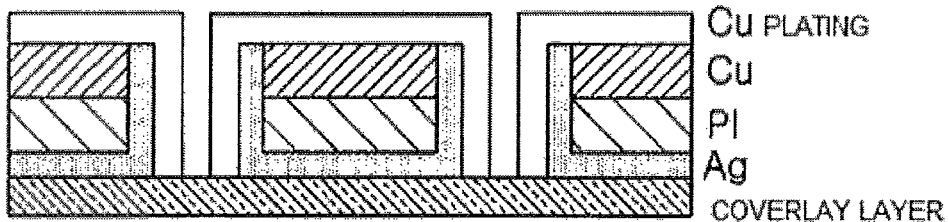

Hereinafter, preferred embodiments of the present invention will be described in detail.

Example 1

Manufacturing a Single-sided Copper Clad Laminate

A metal foil having a thickness of 18 μm was adhered to a copper foil using an epoxy-nitrile-butadiene rubber (NBR) based adhesive on a polyimide film substrate, and then was deposited by a laminating method.

Formation of Via-holes

The via-hole was formed by punching a position at which the via-hole will be formed in the copper clad laminate including the copper layer formed thereon using a punching machine (Yamaha Co.).

Formation of a Circuit Pattern Using a Conductive Paste and Formation of a Plated Bottom Layer by Charging the Conductive Paste in the Via-hole A reactor with a stirrer was charged with 73.61 g of 2-ethylhexyl ammonium 2-ethylhexylcarbamate (243.34 mM) and 18.8 g of silver oxide (81.1 mM) and stirred for 3 hours, and then this reactant was filtered using a 1250 mesh to remove unreacted silver oxide, thereby preparing a conductive silver paste having a silver solid content of 18.9%.

The conductive silver paste prepared as described above was printed on the other side of the substrate by a rotary screen printing method to form the desired pattern. At the time of printing, the conductive silver paste was simultaneously filled in the through-hole to form a connecting conductor through which both sides of the substrate are connected.

Plating

In order to electroplate the copper foil surface of the copper clad laminate, the circuit pattern formed by printing the conductive paste thereon, and the via-hole including the plated bottom layer formed thereon, current was applied at 2.5 A/m$^2$ in a state in which copper was used as an anode and the printed circuit board was served as a cathode while passing the board through a water tank in which copper sulfate solution (125 g/L) is filled at 35° C., thereby forming a copper plating layer at a thickness of 18 μm on an inner wall of the through-hole including the conductive layer formed thereon by the conductive silver paste.

Formation of a Coverlay Layer

A film coated with a hot-melt curable resin was deposited on a 12.5 μm polyimide film by a hot-melt laminating method to form the coverlay layer.

Etching

After a dry film was adhered the coverlay layer at a temperature of 100° C., a pressure of 3.5 kg/cm$^2$, and rate of 1.5 m/min using a 30 μm soft dry film and UV light source having a light intensity of 18 mj/cm$^2$ was irradiated, etching was performed at a temperature of 48° C., a nozzle pressure of 1.5 kg/cm$^2$, and a rate of 2.5 m/min using HCl and NaClO$_3$, followed by separation using NaOH, thereby forming the desired pattern.

Example 2

A double-sided printed circuit board was manufactured by the same method as in Example 1 except that a conductive paste was prepared as follow in a step of forming a circuit pattern using the conductive paste and filling the conductive paste to form a plated bottom layer.

A reactor with a stirrer was charged with 15.34 g of isopropyl ammonium isopropylcarbamate (81.1 mM), 49.07 g of 2-ethylhexyl ammonium 2-ethylhexylcarbamate (162.2 mM), and 18.8 g of silver oxide (81.1 mM) and stirred for 3 hours, and then this reactant was filtered using a mesh filter to remove unreacted silver oxide, thereby preparing a conductive silver paste having a silver solid content of 21%.

Example 3

A double-sided printed circuit board was manufactured by the same method as in Example 1 except that a conductive paste was prepared as follow in a step of forming a circuit pattern using the conductive paste and filling the conductive paste to form a plated bottom layer.

A reactor with a stirrer was charged with 812.1 g of 2-ethylhexyl ammonium 2-ethylhexylcarbamate (2.68 M) and 187.9 g of silver oxide (0.89 M) and stirred for 3 hours, thereby preparing a silver complex compound. The reactor with a stirrer was charged with 20.44 g of the prepared silver complex compound, 36.42 g of silver nanoparticles (Ferro Co.), and 43.14 g of 2-ethylhexyl ammonium 2-ethylhexylcarbamate, and primary stirring was performed. Secondary dispersion was performed on the mixture obtained by primary stirring, thereby preparing a conductive silver paste having a silver solid content of 40%.

Example 4

A double-sided printed circuit board was manufactured by the same method as in Example 1 except that a conductive paste was prepared as follow in a step of forming a circuit pattern using the conductive paste and filling the conductive paste to form a plated bottom layer.

A reactor with a stirrer was charged with 812.1 g of 2-ethylhexyl ammonium 2-ethylhexylcarbamate (2.68 M) and 187.9 g of silver oxide (0.89 M) and stirred for 3 hours, thereby preparing a silver complex compound. The reactor with a stirrer was charged with 25.52 g of the prepared silver complex compound, 45.53 g of silver nanoparticles (Ferro Co.), and 28.95 g of 2-ethylhexyl ammonium 2-ethylhexylcarbamate, and primary stirring was performed. Secondary dispersion was performed on the mixture obtained by primary stirring, thereby preparing a conductive silver paste having a silver solid content of 50%.

Example 5

A double-sided printed circuit board was manufactured by the same method as in Example 1 except that a conductive paste was prepared as follow in a step of forming a circuit pattern using the conductive paste and filling the conductive paste to form a plated bottom layer.

In a round bottom flask installed with a condenser, 40 g of silver oxide was added to 100 g of 60 weight % ethylamine (aqueous solution), and the temperature was maintained at 10° C. while dispersing the solution using an ultrasonic wave, followed by stirring for 30 minutes. Continuously, a mixed solution of 30 g of butyrolactone and 30 g of methylethylketone was dropped in the above solution at a rate of 5 ml/min, followed by reflux for 40 minutes in a state in which the temperature of the flask was maintained at 95 to 100° C., thereby dissolving silver oxide. The mixture was distilled under reduced pressure at 10° C. to remove excessive ethylamine, thereby preparing a conductive silver paste having a silver solid content of 36.5%.

Example 6

A double-sided printed circuit board was manufactured by the same method as in Example 1 except that a conductive paste was prepared as follow in a step of forming a circuit pattern using the conductive paste and filling the conductive paste to form a plated bottom layer.

In a round bottom flask installed with a condenser, 40 g of silver oxide (I) was added to 100 g of 60 weight % benzylamine (aqueous solution), and the temperature was maintained at 10° C. while dispersing the solution using an ultrasonic wave, followed by stirring for 30 minutes. Continuously, a mixed solution of 30 g of ethylene carbonate and 40 g of acetonitrile was dropped in the above solution at a rate of 5 ml/min, followed by reflux for 40 minutes in a state in which the temperature of the flask was maintained at 95 to 100° C., thereby dissolving silver oxide. The mixture was distilled under reduced pressure at 35° C. to remove excessive benzylamine, thereby preparing a conductive silver paste having a silver solid content of 32.0%.

Example 7

A double-sided printed circuit board was manufactured by the same method as in Example 1 except that a method of using a gravure printer was used as the printing method in a step of forming a circuit pattern using the conductive paste and filling the conductive paste to form a plated bottom layer.

Example 8

A double-sided printed circuit board was manufactured by the same method as in Example 1 except that a flexo printing method was used as the printing method in a step of forming a circuit pattern using the conductive paste and filling the conductive paste to form a plated bottom layer.

Example 9

A double-sided printed circuit board was manufactured by the same method as in Example 1 except that after plating was performed after a coverlay layer was formed.

Example 10

A double-sided printed circuit board was manufactured by the same method as in Example 1 except that a primer layer was formed at a thickness of 350 nm printing a bisphenol-A type liquid resin (Kukdo Chemical Co.) by a roll-to-roll printing method in a dry kiln at 170° C. at a moving rate of 10 m/min.

INDUSTRIAL APPLICABILITY

As set forth above, with the method for manufacturing a double-sided printed circuit pattern according to the present invention, the precise circuit pattern having high conductivity may be formed, the raw materials and manufacturing processes may be reduced, and the double-sided flexible printed circuit board having high reliability without the risk of disconnection even when a conductive layer is bent, refracted, or exposed to heat or physical impact may be provided.

The invention claimed is:
1. A method for manufacturing a double-sided flexible printed circuit board, the method comprising the steps of:
(A) preparing a single-sided copper clad laminate or forming a copper layer on a single side of a flexible base substrate to manufacture the single-sided copper clad laminate;
(B) forming via-holes in the flexible base substrate through the single-sided copper clad laminate;
(C) printing a conductive paste on the other side of the copper foil of the single-sided copper clad laminate to form a plated bottom layer on the via-hole simultaneously with forming a circuit pattern;
(D) plating a copper clad surface of the single-sided copper clad laminate, the via-hole including the plated bottom layer formed thereon, and the circuit pattern formed by printing the conductive paste;
(E) forming a coverlay layer on the conductive paste-printed surface; and
(F) etching the copper clad surface of the copper clad laminate to form a circuit.
2. The method of claim 1, wherein the conductive paste contains an organic silver complex compound.
3. The method of claim 2, wherein the organic silver complex compound is obtained by reacting at least one silver compound of the following Chemical Formula 1 with at least one ammonium carbamate- or ammonium carbonate-based compound of the following Chemical Formula 2, 3, or 4

$Ag_nX$           (Chemical Formula 1)

(n is an integer of 1 to 4, and X is a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof)

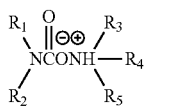
(Chemical Formula 2)

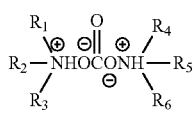
(Chemical Formula 3)

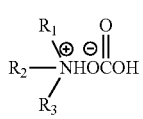
(Chemical Formula 4)

($R_1$, $R_2$, $R_3$, $R_4$, $R_5$, and $R_6$ are the same or different and are substituents selected from hydrogen, aliphatic or alicyclic alkyl, aryl, or aralkyl having 1 to 30 carbon atoms, functional group substituted alkyl or aryl, a heterocyclic compound, a polymer compound, and derivatives thereof, respectively).

4. The method of claim 2, wherein the conductive paste further contains a conductor, a metal precursor, or a mixture of at least one thereof.

5. The method of claim 4, wherein the conductor contains at least one metal selected from Ag, Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac, and Th, an alloy thereof, or alloy oxide thereof, or contains at least one component selected from conductive carbon black, graphite, carbon nano-tubes, and conductive polymers.

6. The method of claim 4, wherein the metal precursor is selected form the metal compounds represented by the following Chemical Formula 5

MnX  (Chemical Formula 5)

wherein the conductor comprises at least one metal selection from Ag, Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac and Th, an alloy thereof or alloy oxide thereof, n is an integer of 10 or less, and X is a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, mercapto, amide, alkoxide, carboxylate, and derivatives thereof).

7. The method of claim 6, wherein the metal precursor contains at least one component selected from a group consisting of metal gold acetate, palladium oxalate, silver 2-ethylhexanoate, copper 2-ethylhexanoate, iron stearate, nickel formate, zinc citrate, bismuth acetate, silver nitrate, copper cyanate, cobalt carbonate, platinum chloride, chloroauric acid, tetrabutoxytitanium, dimethoxy-zirconium dichloride, aluminum isopropoxide, tin tetrafluoroborate, vanadium oxide, indium-tin oxide, ruthenium oxide, tantalum methoxide, dodecyl mercapto gold, and indium acetylacetonate.

8. The method of claim 4, wherein the used amount of the conductor, the metal precursor, or a mixture thereof is 1 to 90% by weight based on the total weight of the paste composition.

9. The method of claim 4, wherein the conductor or the metal precursor is in a state selected from a group consisting of a particles state, a powder state, a flake state, a colloid state, a hybrid state, a paste state, a sol state, a solution state, and a mixed state thereof.

10. The method of claim 4, wherein the conductor and the metal precursor have at least one shape selected from a spherical shape, a linear shape, a plate shape, and a mixed shape thereof.

11. The method of claim 1, wherein Step C is performed using the conductive paste by a method selected from a gravure printing method, an inkjet printing method, an offset printing method, a silk screen printing method, a rotary screen printing method, a flexo printing method, and an imprinting method.

12. The method of claim 1, wherein, after the conductive paste is printed to form the circuit pattern and the plated bottom layer, a post-treatment process selected from oxidation treatment, reduction treatment, thermal treatment, infrared (IR) treatment, ultraviolet (UV) treatment, electron beam irradiation treatment, and laser treatment is performed.

13. The method of claim 12, wherein the thermal treatment is performed at 80 to 400° C.

14. The method of claim 1, wherein the coverlay layer is manufactured by any one of a method of punching, laminating or hot pressing a polyimide film to form the coverlay layer, a method of printing and curing photo solder resist (PSR) ink to form the coverlay layer, and a method of curing the curing ink to form the coverlay layer.

15. A method for manufacturing a double-sided flexible printed circuit board, the method comprising the steps of:
(A) preparing a single-sided copper clad laminate or forming a copper layer on a single side of a base member to manufacture the single-sided copper clad laminate;
(B) forming a primer layer on an opposite side of the copper clad laminate in order to improve adhesive force;
(C) forming via-holes in the single-sided copper clad laminate; (D) printing a conductive paste on the other side of the copper foil of the single-sided copper clad laminate to form a plated bottom layer on the via-hole simultaneously with forming a circuit pattern;
(E) plating a copper clad surface of the single-sided copper clad laminate, the via-hole including the plated bottom layer formed thereon, and the circuit pattern formed by printing the conductive paste;
(F) forming a coverlay layer on the conductive paste-printed surface; and (G) etching the copper clad surface of the copper clad laminate to form a circuit.

16. The method of claim 15, wherein a. sequence of step B and step C is changed.

* * * * *